(12) United States Patent
Nishiguchi et al.

(10) Patent No.: US 9,090,992 B2
(45) Date of Patent: Jul. 28, 2015

(54) METHOD OF MANUFACTURING SINGLE CRYSTAL

(75) Inventors: Taro Nishiguchi, Itami (JP); Makoto Sasaki, Itami (JP); Shin Harada, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 981 days.

(21) Appl. No.: 13/257,742

(22) PCT Filed: Nov. 12, 2010

(86) PCT No.: PCT/JP2010/070175
§ 371 (c)(1),
(2), (4) Date: Sep. 20, 2011

(87) PCT Pub. No.: WO2011/065239
PCT Pub. Date: Jun. 3, 2011

(65) Prior Publication Data
US 2012/0006255 A1    Jan. 12, 2012

(30) Foreign Application Priority Data
Nov. 30, 2009    (JP) .................. 2009-272012

(51) Int. Cl.
C30B 29/36    (2006.01)
C30B 23/02    (2006.01)
(52) U.S. Cl.
CPC ............... *C30B 29/36* (2013.01); *C30B 23/025* (2013.01)
(58) Field of Classification Search
USPC .................. 117/100, 105, 109, 952
See application file for complete search history.

(56) References Cited

U.S. PATENT DOCUMENTS

| | | | |
|---|---|---|---|
| 5,908,503 A | 6/1999 | Sumiya et al. | |
| 6,786,969 B2 | 9/2004 | Kondo et al. | |
| 2001/0000864 A1 | 5/2001 | Shiomi et al. | |
| 2002/0083892 A1 | 7/2002 | Kondo et al. | |
| 2005/0166833 A1 | 8/2005 | Norikane et al. | |
| 2007/0209580 A1* | 9/2007 | Kondo et al. | 117/204 |
| 2011/0088612 A1 | 4/2011 | Ishihara et al. | |

FOREIGN PATENT DOCUMENTS

| | | |
|---|---|---|
| CN | 1225953 A | 8/1999 |
| EP | 2 309 039 A1 | 4/2011 |
| JP | 09-165295 | 6/1997 |
| JP | H09-268096 A | 10/1997 |
| JP | 52-134007 | 11/1997 |
| JP | 2001-139394 | 5/2001 |
| JP | 2002-201097 A | 7/2002 |
| JP | 2003-119098 | 4/2003 |
| JP | 2003-226600 | 8/2003 |
| JP | 2009-256193 | 11/2009 |
| JP | 2010-132464 | 6/2010 |
| WO | WO 2010/001709 A1 | 1/2010 |

* cited by examiner

*Primary Examiner* — Robert M Kunemund
(74) *Attorney, Agent, or Firm* — Drinker Biddle & Reath LLP

(57) ABSTRACT

A seed crystal having a frontside surface and a backside surface is prepared. Surface roughness of the backside surface of the seed crystal is increased. A coating film including carbon is formed on the backside surface of the seed crystal. The coating film and a pedestal are brought into contact with each other with an adhesive interposed therebetween. The adhesive is cured to fix the seed crystal to the pedestal. A single crystal is grown on the seed crystal. Before the growth is performed, a carbon film is formed by carbonizing the coating film.

22 Claims, 3 Drawing Sheets

METHOD OF MANUFACTURING SINGLE CRYSTAL

TECHNICAL FIELD

The present invention relates to a method of manufacturing a single crystal, and in particular to a method of manufacturing a single crystal using a seed crystal fixed on a pedestal.

BACKGROUND ART

In recent years, silicon carbide single crystal substrates have been adopted as semiconductor substrates for use in manufacturing semiconductor devices. Silicon carbide has a band gap larger than that of silicon, which has been used more commonly in the field of semiconductor. Hence, a semiconductor device employing silicon carbide advantageously has a large reverse breakdown voltage, low on-resistance, and has properties less likely to decrease in a high temperature environment.

A silicon carbide single crystal is manufactured using a sublimation-recrystallization method. Specifically, a silicon carbide single crystal is grown on a surface of a seed crystal fixed on a pedestal. If the seed crystal is not uniformly fixed on the pedestal, the single crystal grown on the seed crystal may have a reduced quality. Thus, as a method of mounting the seed crystal to the pedestal, for example, the following two methods have been proposed.

Firstly, according to Japanese Patent Laying-Open No. 2001-139394 (Patent Literature 1), when a single crystal is grown, a carbon composite structure having graphite fine particles and non-graphitizable carbon is formed in an interface between a seed crystal and a seed crystal pedestal. This publication describes that, since carbon is thereby uniformly formed all over an attachment surface using heat-resistant fine particles uniformly dispersed in the attachment surface as cores, and covers an attachment surface of the seed crystal, it is possible to prevent occurrence of recrystallization in the attachment surface of the seed crystal to be attached to the pedestal during growth of the single crystal, and it is also possible to prevent etching which may occur at a central portion of the seed crystal in an early stage of the growth.

Secondly, according to Japanese Patent Laying-Open No. 2003-226600 (Patent Literature 2), a silicon carbide seed crystal having a protective film with a thickness of 0.5 to 5 μm formed on a backside surface thereof is mechanically mounted on a graphite crucible lid. This publication describes that, since the protective film can prevent sublimation of Si atoms from the backside surface of the seed crystal, generation of voids in a crystal is suppressed.

CITATION LIST

Patent Literature

PTL 1: Japanese Patent Laying-Open No. 2001-139394
PTL 2: Japanese Patent Laying-Open No. 2003-226600

SUMMARY OF INVENTION

Technical Problem

In the technique of Japanese Patent Laying-Open No. 2001-139394 (Patent Literature 1), there has been a possibility that strength of fixing between the seed crystal and the pedestal may be insufficient, depending on the material for the seed crystal. In particular, if the temperature between the seed crystal and the pedestal is set to a high temperature as in the case where, for example, a silicon carbide single crystal is grown, the strength of fixing described above has been likely to be reduced. Therefore, there has been a possibility that a portion or all of the seed crystal may be detached from the pedestal. Hence, there has been a possibility that the quality of the obtained single crystal may be reduced.

As to the technique of Japanese Patent Laying-Open No. 2003-226600 (Patent Literature 2), the present inventors have found as a result of examination that protection of the backside surface of the seed crystal is insufficient. For example, if a silicon carbide seed crystal is used, the effect of preventing sublimation of the backside surface of the seed crystal is not sufficient, and as a result, there has been a possibility that the quality of the obtained single crystal may be reduced.

The present invention has been made in view of the aforementioned problem, and one object of the present invention is to provide a method of manufacturing a single crystal capable of growing a high-quality single crystal using a seed crystal fixed on a pedestal.

Solution to Problem

A method of manufacturing a single crystal according to one aspect of the present invention includes the steps of: preparing a seed crystal having a frontside surface and a backside surface; increasing surface roughness of the backside surface of the seed crystal; forming a coating film including carbon on the backside surface of the seed crystal after the surface roughness is increased; bringing the coating film and a pedestal into contact with each other with an adhesive interposed therebetween; curing the adhesive to fix the seed crystal to the pedestal; and growing the single crystal on the seed crystal. Before the growth is performed, a carbon film is formed by carbonizing the coating film.

A method of manufacturing a single crystal in accordance with another aspect of the present invention includes the steps of: preparing a seed crystal having a frontside surface and a backside surface, the backside surface being an as-sliced surface formed by slicing with a wire saw; forming a coating film including carbon on the backside surface of the seed crystal; bringing the coating film and a pedestal into contact with each other with an adhesive interposed therebetween; curing the adhesive to fix the seed crystal to the pedestal; and growing the single crystal on the seed crystal fixed to the pedestal. Before the growth is performed, a carbon film is formed by carbonizing the coating film.

Preferably, the step of increasing the surface roughness of the backside surface is performed by treating the backside surface using abrasive grains. More preferably, grain size distribution of the abrasive grains has a component of not less than 16 μm.

Preferably, the coating film is an organic film, and the carbon film is formed by carbonizing the organic film. More preferably, the organic film is formed of an organic resin. Further preferably, the organic resin is a photosensitive resin.

Preferably, the step of forming the coating film is performed using spin coating. In addition, preferably, the pedestal is polished prior to the step of bringing the coating film and the pedestal into contact with each other with the adhesive interposed therebetween.

Preferably, the adhesive includes a resin which will become non-graphitizable carbon by being heated, heat-resistant fine particles, and a solvent. More preferably, the adhesive includes a carbohydrate.

Preferably, the single crystal is a silicon carbide single crystal. In addition, preferably, a surface of the pedestal facing the seed crystal includes a surface made of carbon.

Advantageous Effects of Invention

According to the method of manufacturing a single crystal in accordance with the present invention, when growth of a single crystal is performed, a carbon film is provided on the backside surface of the seed crystal, and since the carbon film is made of carbon, it is firmly and uniformly bonded with the cured adhesive. Further, since the carbon film is formed on the backside surface of the seed crystal as a surface having an increased surface roughness, with high adhesiveness. That is, the carbon film is firmly bonded to each of the adhesive and the seed crystal. Therefore, the seed crystal is firmly and uniformly fixed to the pedestal with the adhesive interposed therebetween, and thus the single crystal grown on the seed crystal has an improved quality.

DESCRIPTION OF EMBODIMENTS

Hereinafter, an embodiment of the present invention will be described with reference to the drawings.

Figure 1:
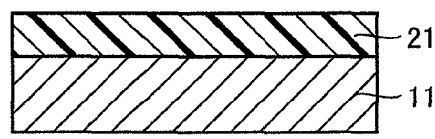
FIG. 1 is a cross sectional view schematically showing a first step of a method of manufacturing a single crystal according to one embodiment of the present invention.

Referring to FIG. 1, a seed crystal 11 is prepared. Seed crystal 11 has a frontside surface (lower surface in the drawing) as a surface on which a single crystal will grow, and a backside surface (upper surface in the drawing) as a surface to be mounted to a pedestal. For example, seed crystal 11 is formed of silicon carbide (SiC). Seed crystal 11 has a thickness (dimension in the vertical direction in the drawing) of, for example, not less than 0.5 mm and not more than 10 mm. In addition, the planar shape of seed crystal 11 is, for example, a circle, and the diameter thereof is preferably not less than 25 mm, and more preferably not less than 100 mm. Further, the tilt of the plane orientation of the seed crystal from the (0001) plane, that is, the off angle, is preferably not more than 15°, and more preferably not more than 5°.

Next, treatment to further increase surface roughness of the backside surface of seed crystal 11 is performed. This treatment can be performed by polishing the backside surface using abrasive grains having a sufficiently large grain size. Preferably, grain size distribution of the abrasive grains has a component of not less than 16 μm. An average grain size of the abrasive grains is preferably not less than 5 μm and not more than 50 μm, more preferably not less than 10 μm and not more than 30 μm, and further preferably 12 to 25 μm.

Preferably, the abrasive grains described above are diamond particles. In addition, preferably, the abrasive grains described above are used in a state dispersed in slurry. Thus, the polishing described above is preferably performed using diamond slurry. Generally, diamond slurry containing diamond particles which have an average grain size of not less than 5 μm and not more than 50 μm and whose grain size distribution has a component of not less than 16 μm is easily available.

It is to be noted that, instead of performing treatment to further increase surface roughness of the backside surface of seed crystal 11 as described above, it is also possible to form a backside surface originally having a sufficiently large surface roughness and use the backside surface without polishing it. Specifically, the backside surface of seed crystal 11 formed by slicing with a wire saw may be used without being polished. That is, an as-sliced surface, which is a surface formed by slicing and not polished thereafter, may be used as the backside surface. Preferably, the abrasive grains described above are used for the slicing with a wire saw.

Next, a coating film 21 including carbon is formed on the backside surface of seed crystal 11. Preferably, coating film 21 has a surface roughness smaller than that of the backside surface of seed crystal 11 on which coating film 21 is formed.

Preferably, this formation is performed by applying a liquid material, and more preferably, the liquid material does not contain a solid such as fine particles. Thereby, thin coating film 21 can be formed easily and uniformly.

In the present embodiment, coating film 21 is an organic film. Preferably, the organic film is formed of an organic resin. As the organic resin, for example, various resins such as an acrylic resin, a phenolic resin, a urea resin, and an epoxy resin can be used, and a resin composed as a photosensitive resin that is cross-linked or decomposed by action of light can also be used. As the photosensitive resin, a positive or negative photoresist used for manufacturing semiconductor devices can be used. Since the technique of applying these materials by spin coating has already been established, the thickness of coating film 21 can be easily controlled. Spin coating is performed, for example, as described below.

Firstly, seed crystal 11 is suctioned onto a holder. Seed crystal 11 is rotated by rotating the holder at a prescribed rotation speed. A photoresist is dropped on rotating seed crystal 11, and thereafter rotation is continued for a prescribed time period to apply the photoresist thinly and uniformly. To ensure uniformity over an entire surface of seed crystal 11, for example, the rotation speed is set to 1000 to 10000 rotations/minute, the time period is set to 10 to 100 seconds, and the application thickness is set to not less than 0.1 μm.

Then, the applied photoresist is dried and thereby cured. The drying temperature and the drying time period can be selected as appropriate depending on the material for the photoresist and the application thickness thereof. Preferably, the drying temperature is not less than 100° C. and not more than 400° C., and the drying time period is not less than 5 minutes and not more than 60 minutes. For example, when the drying temperature is 120° C., the time period required for volatilization is, for example, 15 minutes for a thickness of 5 μm, 8 minutes for a thickness of 2 μm, and 3 minutes for a thickness of 1 μm.

It is to be noted that, although coating film 21 can be formed if the step of applying and drying the photoresist described above is performed once, thicker coating film 21 may be formed by repeating this step. Since repeating this step too many times is not preferable as it takes time more than necessary for this step, it is generally preferable to limit the number of repetitions to about two or three.

Figure 2:
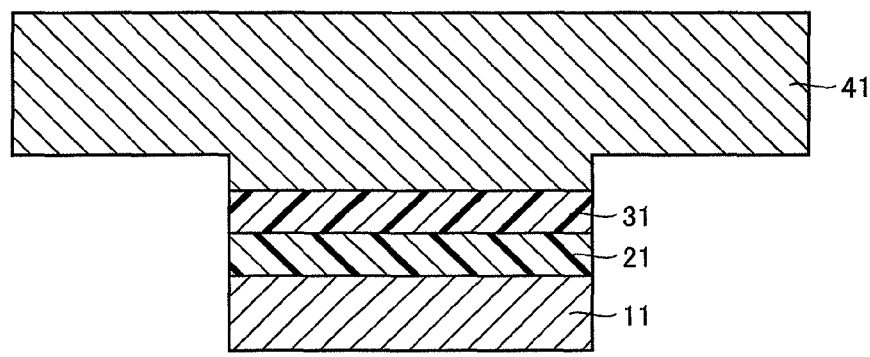
FIG. 2 is a cross sectional view schematically showing a second step of the method of manufacturing a single crystal according to one embodiment of the present invention.

Referring to FIG. 2, a pedestal 41 having a mounting surface on which seed crystal 11 is to be mounted is prepared. The mounting surface includes a surface preferably made of carbon. For example, pedestal 41 is formed of graphite. Preferably, the mounting surface is polished to improve flatness of the mounting surface.

Next, coating film 21 and pedestal 41 are brought into contact with each other, with an adhesive 31 interposed therebetween. Preferably, the contact is performed such that the both press against each other at a temperature of not less than 50° C. and not more than 120° C., and under a pressure of not less than 0.01 Pa and not more than 1 MPa. Further, if adhesive 31 is applied so as not to spread out of a region sandwiched between seed crystal 11 and pedestal 41, an adverse effect of adhesive 31 in the step of growing a single crystal using seed crystal 11 described later can be suppressed.

Preferably, adhesive 31 includes a resin which will become non-graphitizable carbon by being heated and thereby carbonized, heat-resistant fine particles, and a solvent. More preferably, adhesive 31 further includes a carbohydrate.

The resin which will become non-graphitizable carbon is, for example, a novolak resin, a phenol resin, or a furfuryl alcohol resin.

The heat-resistant fine particles have a function of uniformly distributing the non-graphitizable carbon described above in a fixing layer formed by heating adhesive 31 to a high temperature, and thereby increasing the filling rate of the fixing layer. As a material for the heat-resistant fine particles, a heat-resistant material such as carbon (C) including graphite, silicon carbide (SiC), boron nitride (BN), and aluminum nitride (AlN) can be used. In addition, a high melting point metal, or a compound such as a carbide or a nitride thereof can also be used as a material other than those described above. As the high melting point metal, for example, tungsten (W), tantalum (Ta), molybdenum (Mo), titanium (Ti), zirconium (Zr), or hafnium (Hf) can be used. The heat-resistant fine particles have a grain size of, for example, 0.1 to 10 μm.

As the carbohydrate, a saccharide or a derivative thereof can be used. The saccharide may be a monosaccharide such as glucose, or a polysaccharide such as cellulose.

As the solvent, a solvent that can dissolve and disperse the resin and the carbohydrate described above is selected as appropriate. Further, the solvent is not limited to a solvent composed of a single type of liquid, and may be a mixed liquid containing plural types of liquids. For example, a solvent including alcohol for dissolving the carbohydrate and cellosolve acetate for dissolving the resin may be used.

The ratio among the resin, the carbohydrate, the heat-resistant fine particles, and the solvent in adhesive 31 is selected as appropriate to obtain suitable adhesion and fixing strength of seed crystal 11. In addition, the components of adhesive 31 may include a component other than those described above, and may include, for example, an additive such as a surfactant, a stabilizer, and the like. Further, the application amount of adhesive 31 is preferably not less than 10 mg/cm$^2$ and not more than 100 mg/cm$^2$. Furthermore, the thickness of adhesive 31 is preferably not more than 100 μm, and more preferably not more than 50 μm.

Next, preferably, adhesive 31 is prebaked. Preferably, the prebaking is performed at a temperature of not less than 150° C.

Figure 3:
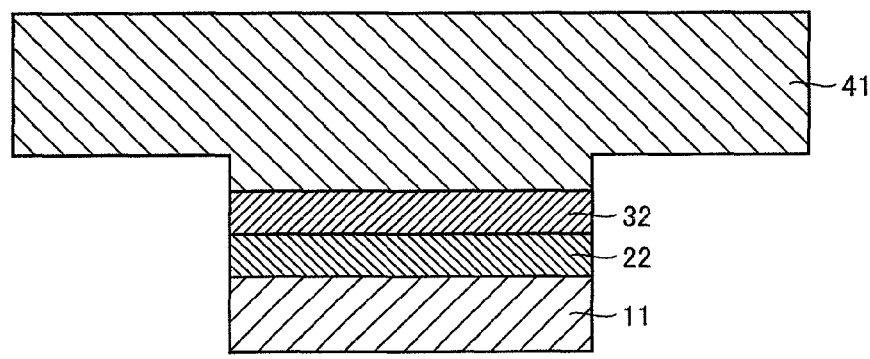
FIG. 3 is a cross sectional view schematically showing a third step of the method of manufacturing a single crystal according to one embodiment of the present invention.

Further, referring to FIG. 3, coating film 21 and adhesive 31 (FIG. 2) are heated. As a result of the heating, coating film 21 is carbonized and becomes a carbon film 22. That is, carbon film 22 is formed on seed crystal 11. Further, as a result of the heating, adhesive 31 is cured between carbon film 22 and pedestal 41, and becomes a fixing layer 32. Thereby, seed crystal 11 is fixed to pedestal 41.

Preferably, the heating described above is performed at a temperature of not less than 800° C. and not more than 1800° C., for a time period of not less than one hour and not more than 10 hours, under a pressure of not less than 0.13 kPa and not more than the atmospheric pressure, and in an inactive gas atmosphere. As an inactive gas, for example, helium, argon, or nitrogen gas is used.

Figure 4:
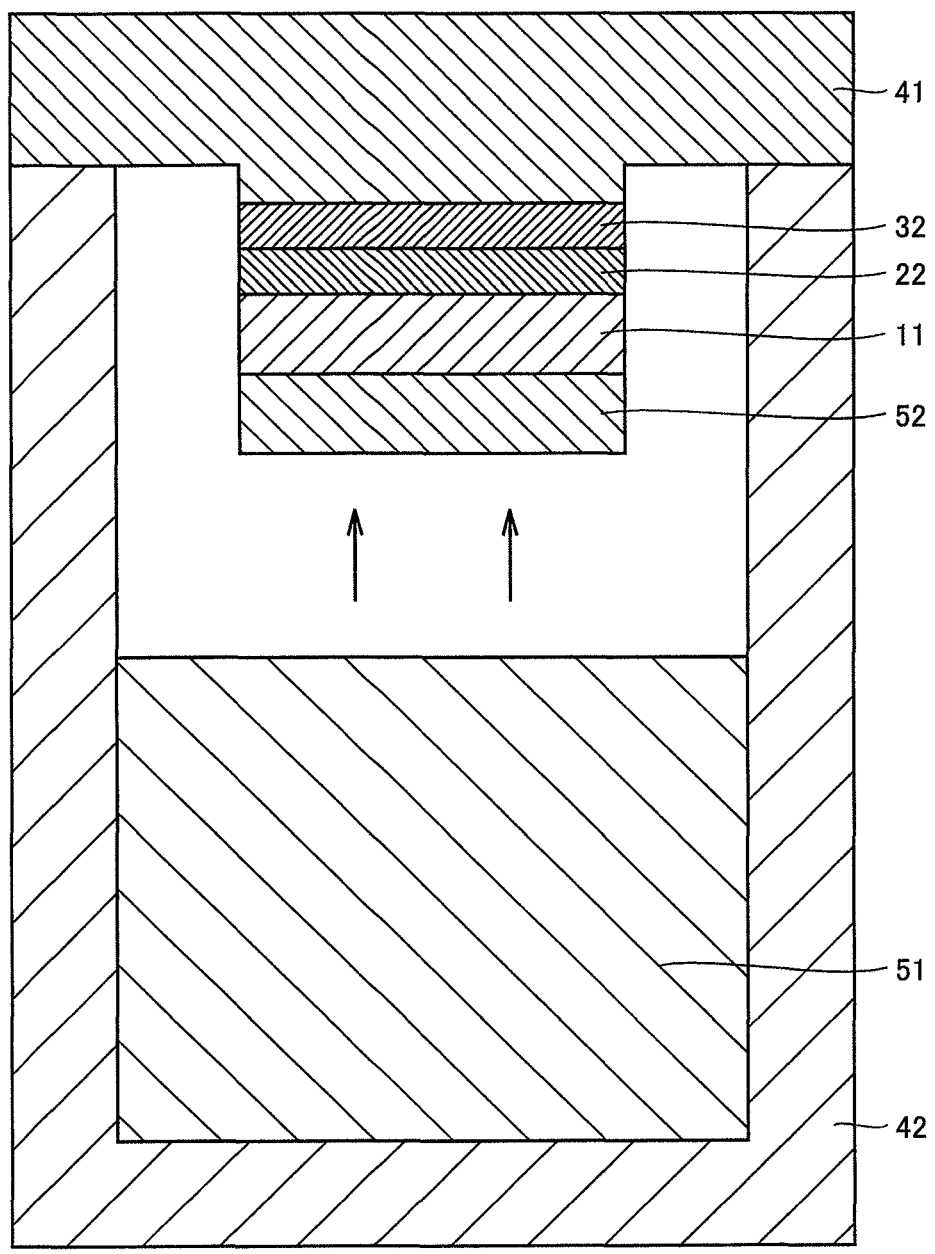
FIG. 4 is a cross sectional view schematically showing a fourth step of the method of manufacturing a single crystal according to one embodiment of the present invention.

Referring to FIG. 4, a source material 51 is placed inside a crucible 42. If a single crystal to be grown is formed of SiC, for example, SiC powder is placed in a graphite crucible. Then, pedestal 41 is mounted such that seed crystal 11 faces the inside of crucible 42. It is to be noted that pedestal 41 may function as a lid for crucible 42 as shown in FIG. 4.

Subsequently, a single crystal 52 is grown on seed crystal 11. In the case where SiC single crystal 52 is manufactured using SiC seed crystal 11, the sublimation-recrystallization method can be used as a forming method therefor. Specifically, single crystal 52 can be grown by subliming source material 51 as indicated by arrows in the drawing, and depositing a sublimate on seed crystal 11. The temperature in the sublimation-recrystallization method is set, for example, to not less than 2100° C. and not more than 2500° C. Further, the pressure in the sublimation-recrystallization method is preferably set, for example, to not less than 1.3 kPa and not more than the atmospheric pressure, and more preferably set to not more than 13 kPa to increase a growth rate.

It is to be noted that, when this growth is performed, coating film 21 (FIG. 2) has already become carbon film 22 (FIG. 3), as already described using FIGS. 2 and 3.

Figure 5:
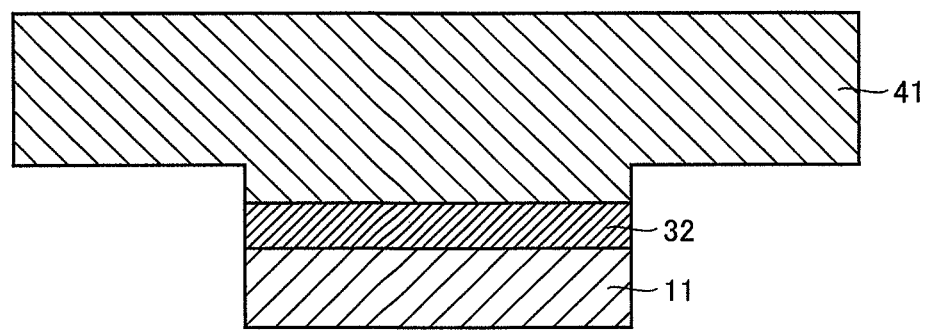
FIG. 5 is a cross sectional view showing one step of a method of manufacturing a single crystal according to a first comparative example.

Referring to FIG. 5, in a first comparative example, seed crystal 11 is bonded to pedestal 41 using fixing layer 32, without carbon film 22 (FIG. 3) interposed therebetween. In the present comparative example, strength of fixing between seed crystal 11 and pedestal 41 may be insufficient, depending on the material for seed crystal 11. Particularly, if the temperature between seed crystal 11 and pedestal 41 is set to a high temperature as in the case where, for example, a SiC single crystal is grown by the sublimation-recrystallization method, the strength of fixing described above is likely to be reduced. For example, an adhesion strength obtained by a fixing layer formed by curing a carbon-based adhesive is likely to be reduced under a temperature of about 2000° C. generally used to grow SiC. As a result, a portion or all of seed crystal 11 may be detached from the pedestal, and thus the quality of the obtained single crystal may be reduced. Further, in this case, while seed crystal 11 is often formed of SiC, and pedestal 41 is often formed of graphite, it is difficult to firmly fix the both using fixing layer 32 due to material properties of the both. For example, although the fixing layer formed by curing a carbon-based adhesive can bond carbon materials (graphites) with high strength, the fixing layer cannot bond a carbon material and SiC with a comparable strength.

In contrast, according to the present embodiment, carbon film 22 is provided on seed crystal 11, and fixing layer 32 fixes carbon film 22 to pedestal 41. That is, fixing layer 32 is joined to carbon film 22, not to seed crystal 11. Thereby, bonding is performed without directly depending on the material for seed crystal 11, and thus seed crystal 11 and pedestal 41 can be fixed more firmly. In particular, when pedestal 41 is formed of carbon such as graphite, carbon film 22 can be firmly bonded to pedestal 41 using the carbon-based adhesive as they are both formed of carbon.

Further, the surface roughness of the backside surface of seed crystal 11 is increased before coating film 21 is formed on the backside surface of seed crystal 11. This can increase adhesiveness between carbon film 22 formed by carbonizing coating film 21 and the backside surface of seed crystal 11.

In addition, preferably, coating film 21 has a surface roughness smaller than that of the backside surface of seed crystal 11 on which coating film 21 is formed. Since this can reduce asperities in the surface to be bonded to pedestal 41, this can prevent occurrence of a portion in which bonding to the pedestal is locally insufficient.

Figure 6:
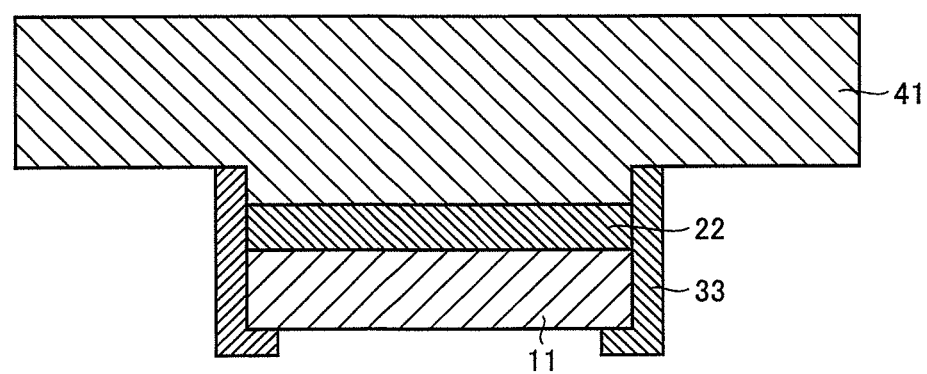
FIG. 6 is a cross sectional view showing one step of a method of manufacturing a single crystal according to a second comparative example.

Referring to FIG. 6, in a second comparative example, seed crystal 11 provided with carbon film 22 with a thickness of 0.5 to 5 μm is fixed to pedestal 41 using a mechanical fixture 33. In the present comparative example, there may occur a gap between seed crystal 11 and pedestal 41, specifically in an interface between carbon film 22 and pedestal 41, due to a difference in thermal expansion coefficient between the material for seed crystal 11 and the material for pedestal 41. If temperature distribution occurs within a growth surface of seed crystal 11 in accordance with distribution of the gap, a uniform single crystal cannot be obtained. In addition, if a material transfers from seed crystal 11 into the gap due to sublimation or the like, composition distribution occurs within the growth surface of seed crystal 11, and as a result, there may occur a case where a uniform single crystal cannot be obtained. In particular, if seed crystal 11 is formed of SiC, Si may transfer into the gap, and the transfer cannot be fully suppressed by carbon film 22 with a thickness of about 0.5 to 5 μm. Consequently, seed crystal 11 has a Si-deficient region, and a micropipe defect may occur in a portion of the single crystal formed on seed crystal 11 which is located on this region.

In contrast, according to the present embodiment, seed crystal 11 is fixed not by a mechanical jig but by firm and uniform joining between carbon film 22 and fixing layer 32. Thus, since the gap as described above is less likely to be generated, occurrence of composition distribution and temperature distribution in seed crystal 11 is suppressed, and thereby single crystal 52 can be manufactured more uniformly. It is to be noted that the temperature distribution can be further suppressed by polishing the mounting surface of pedestal 41.

Although a crystal formed of SiC has been described above as seed crystal 11, a crystal formed of another material may be used. As a material therefor, for example, GaN, ZnSe, ZnS, CdS, CdTe, AlN, or BN can be used.

Further, although coating film 21 is carbonized when adhesive 31 is cured in the present embodiment, coating film 21 may be carbonized before adhesive 31 is formed.

In addition, single crystal 52 may be used to manufacture a substrate such as a SiC substrate. Such a substrate is obtained, for example, by slicing single crystal 52.

EXAMPLES

Example 1

Referring to FIG. 1, a SiC substrate having a thickness of about 3 mm, a diameter of 60 mm, a polytype of 4H, and a plane orientation of (000-1) was prepared as seed crystal 11. A backside surface of seed crystal 11 was mechanically polished using diamond slurry having a grain size of about 15 μm.

Next, seed crystal 11 was mounted on a holder such that the backside surface of seed crystal 11 was exposed. Then, while seed crystal 11 was rotated by rotating the holder at 1450 rotations/minute, a resist liquid containing ethyl lactate and butyl acetate was dropped on the backside surface by about 20 mmg using a dropper, and thereafter, rotation was continued for 20 seconds. Thereby, the resist liquid was applied with a thickness of about 1 μm. Subsequently, drying was performed at 350° C. for 20 minutes, and thus coating film 21 was formed.

Referring to FIG. 2, graphite pedestal 41 having a mounting surface on which seed crystal 11 was to be mounted was prepared. Then, the mounting surface was polished using diamond slurry.

Next, adhesive 31 including a phenol resin, phenol, ethyl alcohol, formaldehyde, water, and a solid carbon component was prepared. Coating film 21 and pedestal 41 were brought into contact with each other, with adhesive 31 interposed therebetween. Adhesive 31 was applied in an amount of about 25 mg/cm$^2$, with a thickness of about 40 μm. The contact was performed under conditions of a temperature of 100° C. and a pressure of 0.1 MPa.

Subsequently, adhesive 31 was prebaked. Specifically, heat treatment at 80° C. for four hours, heat treatment at 120° C. for four hours, and heat treatment at 200° C. for one hour were successively performed.

Next, coating film 21 and adhesive 31 were heated. This heating was performed at 1150° C. for one hour in a helium gas atmosphere at 80 kPa. Coating film 21 and adhesive 31 were carbonized by this heating, and thereby carbon film 22 and fixing layer 32 (FIG. 3) both made of carbon were formed.

Referring to FIG. 4, SiC powder as source material 51 was placed inside graphite crucible 42. Next, pedestal 41 was mounted such that seed crystal 11 faced the inside of crucible 42 and pedestal 41 functioned as a lid for crucible 42.

Subsequently, SiC single crystal 52 was grown on seed crystal 11 by the sublimation-recrystallization method. SiC single crystal 52 was grown at a temperature of 2400° C. and a pressure of 1.7 kPa, for 300 hours.

Next, the obtained SiC single crystal 52 was sliced to obtain a SiC substrate. As a result of evaluating a surface of the SiC substrate, it had a void density of 0/cm$^2$ and a micropipe density of 1/cm$^2$.

Example 2

Although the backside surface of the seed crystal was polished using diamond slurry having a grain size of 15 μm in the example described above, diamond slurry whose grain size distribution had a component with a grain size of not less than 16 μm was used in the present example. According to the present example, adhesiveness between the backside surface of seed crystal 11 and carbon film 22 was further increased.

Comparative Examples

In the case of the first comparative example (FIG. 5), seed crystal 11 fell from pedestal 41 with a probability of one third while the temperature was increasing to perform the sublimation-recrystallization method or while the single crystal was growing. When a surface of a SiC substrate obtained in the case where the falling did not occur was evaluated, it had a void density of 10/cm$^2$ and a micropipe density of 50/cm$^2$.

In the case of the second comparative example (FIG. 6), when a surface of an obtained SiC substrate was evaluated, it had a void density of 120/cm$^2$ and a micropipe density of 300/cm$^2$.

It should be understood that the embodiment and examples disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

11: seed crystal, 21: coating film, 22: carbon film, 31: adhesive, 32: fixing layer, 33: fixture, 41: pedestal, 42: crucible, 51: source material, 52: single crystal.

The invention claimed is:

1. A method of manufacturing a single crystal, comprising the steps of:
   preparing a seed crystal having a frontside surface and a backside surface;
   increasing surface roughness of said backside surface of said seed crystal;
   forming a coating film including carbon on said backside surface of said seed crystal after said step of increasing the surface roughness of said backside surface;
   fixing said seed crystal to a pedestal by bonding said pedestal and said coating film using an adhesive interposed therebetween;
   forming a carbon film by carbonizing said coating film; and
   growing the single crystal on said seed crystal fixed to said pedestal.

2. The method of manufacturing the single crystal according to claim 1, wherein said step of increasing the surface roughness of said backside surface is performed by treating said backside surface using abrasive grains.

3. The method of manufacturing the single crystal according to claim 2, wherein grain size distribution of said abrasive grains has a component of not less than 16 µm.

4. The method of manufacturing the single crystal according to claim 1, wherein said coating film is an organic film, and said carbon film is formed by carbonizing said organic film.

5. The method of manufacturing the single crystal according to claim 4, wherein said organic film is formed of an organic resin.

6. The method of manufacturing the single crystal according to claim 5, wherein said organic resin is a photosensitive resin.

7. The method of manufacturing the single crystal according to claim 1, wherein said step of forming said coating film is performed using spin coating.

8. The method of manufacturing the single crystal according to claim 1, further comprising the step of polishing said pedestal prior to said step of fixing said seed crystal to said pedestal.

9. The method of manufacturing the single crystal according to claim 1, wherein said adhesive includes a resin which will become non-graphitizable carbon by being heated, heat-resistant fine particles, and a solvent.

10. The method of manufacturing the single crystal according to claim 9, wherein said adhesive includes a carbohydrate.

11. The method of manufacturing the single crystal according to claim 1, wherein said seed crystal is formed of silicon carbide.

12. The method of manufacturing the single crystal according to claim 1, wherein a surface of said pedestal facing said seed crystal includes a surface made of carbon.

13. A method of manufacturing a single crystal, comprising the steps of:
    preparing a seed crystal having a frontside surface and a backside surface, said backside surface being an as-sliced surface formed by slicing with a wire saw;
    forming a coating film including carbon on said backside surface of said seed crystal;
    fixing said seed crystal to a pedestal by bonding said pedestal and said coating film using an adhesive interposed therebetween;
    forming a carbon film by carbonizing said coating film; and
    growing the single crystal on said seed crystal fixed to said pedestal.

14. The method of manufacturing the single crystal according to claim 13, wherein said coating film is an organic film, and said carbon film is formed by carbonizing said organic film.

15. The method of manufacturing the single crystal according to claim 14, wherein said organic film is formed of an organic resin.

16. The method of manufacturing the single crystal according to claim 15, wherein said organic resin is a photosensitive resin.

17. The method of manufacturing the single crystal according to claim 13, wherein said step of forming said coating film is performed using spin coating.

18. The method of manufacturing the single crystal according to claim 13, further comprising the step of polishing said pedestal prior to said step of fixing said seed crystal to said pedestal.

19. The method of manufacturing the single crystal according to claim 13, wherein said adhesive includes a resin which will become non-graphitizable carbon by being heated, heat-resistant fine particles, and a solvent.

20. The method of manufacturing the single crystal according to claim 19, wherein said adhesive includes a carbohydrate.

21. The method of manufacturing the single crystal according to claim 13, wherein said seed crystal is formed of silicon carbide.

22. The method of manufacturing the single crystal according to claim 13, wherein a surface of said pedestal facing said seed crystal includes a surface made of carbon.

* * * * *